(12) United States Patent
Farr

(10) Patent No.: US 7,027,230 B2
(45) Date of Patent: Apr. 11, 2006

(54) ASYMMETRIC OPTICAL FOCUSING SYSTEM

(75) Inventor: Mina Farr, Palo Alto, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/700,068

(22) Filed: Nov. 3, 2003

(65) Prior Publication Data
US 2004/0141239 A1    Jul. 22, 2004

Related U.S. Application Data

(60) Provisional application No. 60/423,014, filed on Nov. 1, 2002.

(51) Int. Cl.
*G02B 11/00* (2006.01)

(52) U.S. Cl. .......................... 359/642; 359/668; 385/33
(58) Field of Classification Search ................ 359/642, 359/641, 668, 793–795; 385/52, 31, 33, 385/38, 34, 92–94
See application file for complete search history.

(56) References Cited

U.S. PATENT DOCUMENTS

| 5,031,991 A | * | 7/1991 | Nakatsu et al. ............... 385/33 |
| 6,125,222 A | * | 9/2000 | Anthon ........................ 385/33 |
| 6,212,216 B1 | * | 4/2001 | Pillai ........................... 372/96 |

* cited by examiner

*Primary Examiner*—Hung Xuan Dang
*Assistant Examiner*—Joseph Martinez
(74) *Attorney, Agent, or Firm*—Workman Nydegger

(57) ABSTRACT

An optical focusing system for a MOPA device that produces an astigmatic optical beam that includes a pair of lenses for focusing the optical beam into a single mode optical fiber. The optical beam has separated first and second focal points of origin. The first lens is placed one focal length away from the nearest focal point of origin for collimating the light beam in the vertical plane of beam propagation, while focusing the horizontal plane of beam propagation down into the optical fiber. The second lens only has optical power in the vertical plane of beam propagation, and is disposed one focal length away from the optical fiber for focusing the collimated light into the optical fiber. The beam has a symmetric spot size and numerical aperture in both the vertical and horizontal planes of beam propagation at the point it coherently enters the single mode optical fiber.

33 Claims, 4 Drawing Sheets

ASYMMETRIC OPTICAL FOCUSING SYSTEM

This application claims priority to and the benefit of U.S. Provisional Patent Application Ser. No. 60/423,014, filed on Nov. 1, 2002, which is incorporated herein by reference.

BACKGROUND OF THE INVENTION

1. Field of the Invention

The present invention relates to laser diodes, and more particularly to optical focusing systems for a laser diode output.

2. Background Technology

High power laser sources are used in a wide variety of applications, including pumping solid state lasers and fiber amplifiers, processing materials, providing optical energy for medical application, etc. In order to achieve a sufficiently high optical output, a high power semiconductor laser source can be implemented in a Master Oscillator Power Amplifier (MOPA) structure. A typical MOPA structure includes a diode feedback (DFB) laser as primary source, followed by a planar waveguide amplifier, both formed on the same semiconductor structure.

The problem with the MOPA device is that its optical output beam is not only divergent (by different amounts in the vertical and horizontal planes of beam propagation), but it also has a very high degree of astigmatism. FIGS. 1A and 1B illustrate a conventional MOPA structure, with a laser diode portion 1 producing an optical output beam 2 that traverses through a planar amplifier portion 3 before exiting the MOPA device. In the horizontal plane of beam propagation (i.e., the plane of the amplifier portion 3), the optical beam 2 is allowed to spread laterally as it traverses through the amplifier portion 3 (see FIG. 1A). However, in the vertical plane of beam propagation, the optical beam 2 is guided through the amplifier portion 3, and does not vertically spread until it exits the MOPA device (see FIG. 1B). Thus, the optical beam 2 leaving the MOPA device has two different effective focal points of origin: one near the exit face of the MOPA (in the vertical plane), and one near the junction of the laser diode portion 1 and the amplifier portion 3 (in the horizontal plane). The difference between these focal points of origin is essentially the length of the amplifier portion 3. This mismatch in focal points of origin of the beam in the two orthogonal planes of beam propagation is commonly referred to as astigmatism.

For most applications, the output of the MOPA needs to be focused to a small spot size (i.e., small beam diameter) with very little if any astigmatism, and with a uniform numerical aperture (measure of divergence and convergence), in both orthogonal planes of beam propagation. For example, it is quite common to focus the MOPA optical beam into a single mode optical fiber having a symmetric transmission mode. It is well known that any given optical fiber has an acceptance numerical aperture associated therewith that if exceeded by an incident light beam would prevent all the light from being properly coupled into the fiber. Focusing optics for these applications must therefore compensate not only for the MOPA output divergence, but also for its astigmatism, in focusing the beam to a small symmetric coherent spot with the proper numerical aperture that matches that of the single mode fiber.

In order to generate a greater amount of amplification, newer MOPA designs include longer amplifier portions, which produce greater astigmatism in the MOPA optical beam. As the astigmatism of MOPA devices increases, it becomes more difficult to design and implement focusing systems that correct for such astigmatism and still provide the desired numerical aperture and spot size for the user's application. Conventional optical focusing systems used to correct large amounts of astigmatism utilize complicated arrangements of optical elements that are difficult to align, sensitive to misalignment, and costly to implement.

There is a need for a simple, cost effective optical solution for correcting relatively large astigmatism in an optical source output beam that is easy to align and produces a symmetric spot size output having the desired numerical aperture with diffraction limited performance.

SUMMARY OF THE INVENTION

The present invention is a two element optical focusing system that focuses an astigmatic optical beam down to a desired diameter with a symmetric spot size and numerical aperture.

The optical device of the present invention includes an optical source for producing an optical beam having spaced apart first and second focal points of origin in orthogonal first and second planes of beam propagation of the optical beam, respectively, a first lens disposed in the optical beam having a first optical focusing power in both the first and second planes of beam propagation, wherein the first lens is disposed at a first distance from the first focal point of origin for generally collimating the optical beam in the first plane of beam propagation and for focusing the optical beam down to a first beam diameter in the second plane of beam propagation at an image position located a second distance from the first lens, and a second lens disposed in the optical beam having a second optical focusing power in the first plane of beam propagation and generally no optical focusing power in the second plane of beam propagation, wherein the second lens is disposed at a third distance from the image position for focusing the optical beam down to a second beam diameter in the first plane of beam propagation at the image position.

In another aspect of the present invention, an optical system focuses an optical beam into an input face of an optical fiber, where the optical beam has spaced apart first and second focal points of origin in orthogonal first and second planes of beam propagation of the optical beam, respectively. The optical system includes a first lens disposed in the optical beam having a first optical focusing power in both the first and second planes of beam propagation, wherein the first lens is disposed at a first distance from the first focal point of origin for generally collimating the optical beam in the first plane of beam propagation and for focusing the optical beam down to a first beam diameter in the second plane of beam propagation at an image position located a second distance from the first lens, and a second lens disposed in the optical beam having a second optical focusing power in the first plane of beam propagation and generally no optical focusing power in the second plane of beam propagation, wherein the second lens is disposed at a third distance from the image position for focusing the optical beam down to a second beam diameter in the first plane of beam propagation at the image position.

In yet another aspect of the present invention, a method of focusing an astigmatic optical beam includes the steps of producing an optical beam having spaced apart first and second focal points of origin in orthogonal first and second planes of beam propagation of the optical beam, respectively, placing a first lens in the optical beam having a first optical focusing power in both the first and second planes of beam propagation, wherein the first lens is placed at a first distance from the first focal point of origin for generally collimating the optical beam in the first plane of beam propagation and for focusing the optical beam down to a first beam diameter in the second plane of beam propagation at an image position located a second distance from the first lens, and placing a second lens in the optical beam having a second optical focusing power in the first plane of beam propagation and generally no optical focusing power in the second plane of beam propagation, wherein the second lens is placed at a third distance from the image position for focusing the optical beam down to a second beam diameter in the first plane of beam propagation at the image position.

These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE INVENTION

The present invention is a simple, two element asymmetrical optical focusing system that corrects relatively large astigmatism in an optical beam and focuses it down to a small, symmetric spot size, with a symmetric numerical aperture, that could be launched directly into a single mode optical fiber. The optical focusing system is easy to align, and relatively insensitive to misalignment because it generally collimates the optical beam in the vertical plane of beam propagation.

Figure 1A:
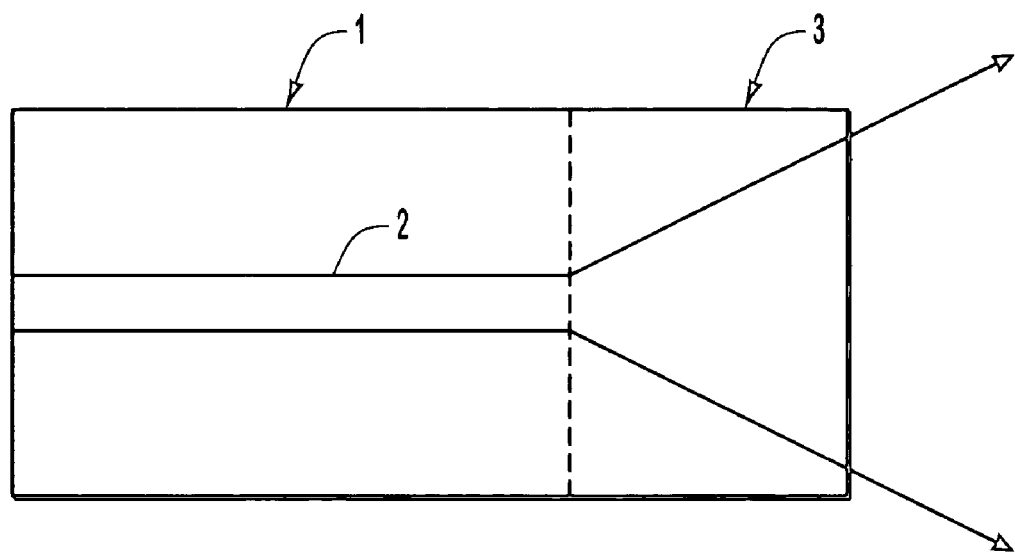
FIG. 1A is a top cross-sectional view of a conventional MOPA device.
Figure 1B:
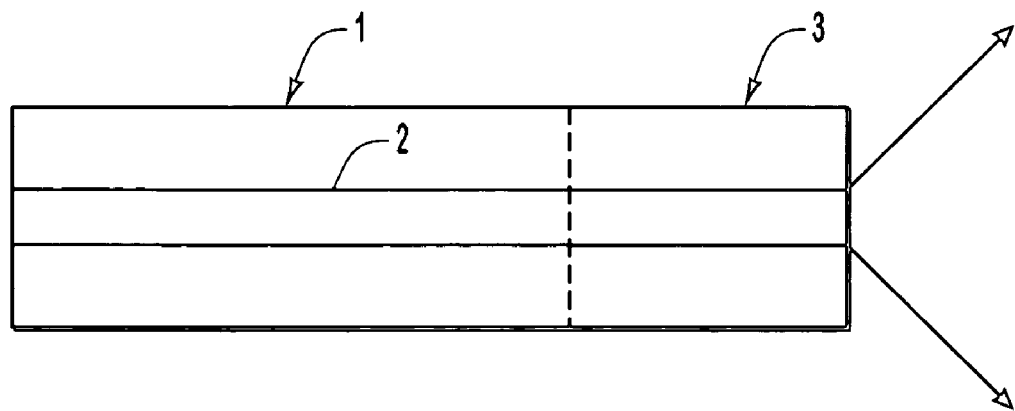
FIG. 1B is a side cross-sectional view of a conventional MOPA device.
Figure 2A:
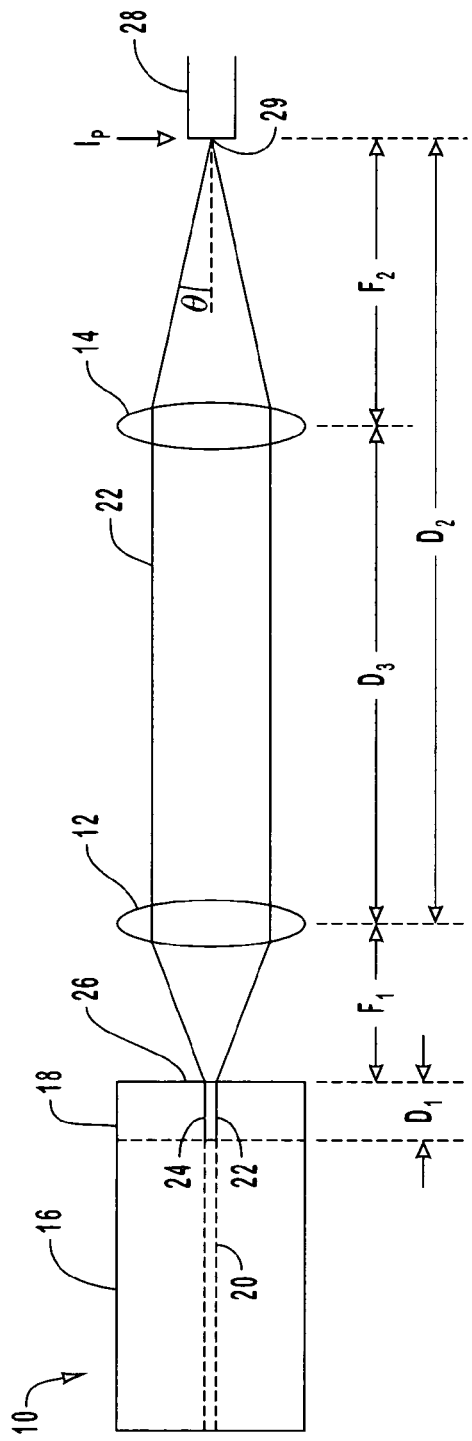
FIG. 2A is a side cross-sectional view of the optical focusing system of the present invention, illustrating the vertical plane of beam propagation.
Figure 2B:
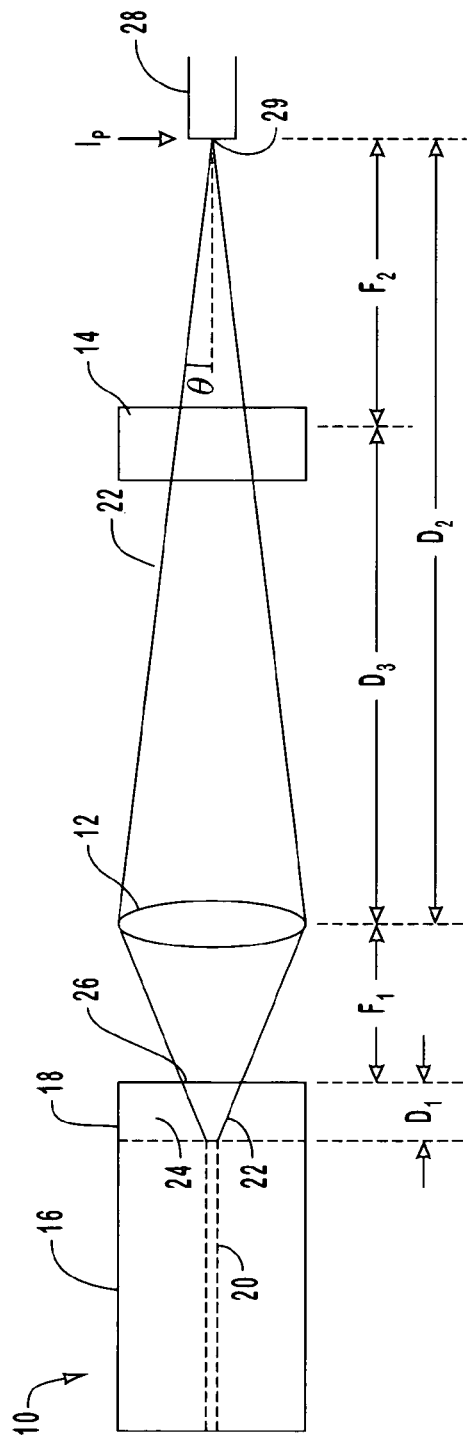
FIG. 2B is a top cross-sectional view of the optical focusing system of the present invention, illustrating the horizontal plane of beam propagation.

The optical focusing system of the present invention for an optical source 10 is shown in FIGS. 2A and 2B, and includes a first focusing element 12 and a second focusing element 14.

The optical source 10 shown in the figures is a MOPA device having a laser diode portion 16 and an amplifier portion 18. However, it should be understood that optical source 10 can be any light source that produces (i.e., generates or delivers) an optical beam having a relatively high astigmatism (significantly high separation between effective focal points of origin in orthogonal planes of beam propagation). The laser diode portion 16 includes an optical cavity 20 that produces an optical light beam 22 which is directed out into the amplifier portion 18. The amplifier portion 18 includes a planar wave guide cavity 24 that has a vertical dimension similar to that of the laser diode optical cavity 20, but a significantly larger lateral dimension compared to that of the laser diode optical cavity 20. Therefore, as the optical beam 22 traverses through amplifier portion 18, it is confined and does not expand significantly in the vertical direction (see FIG. 2A) while it is not confined and does expand significantly in the lateral direction (see FIG. 2B). Therefore, in the vertical plane of beam propagation shown in FIG. 2A, the effective focal point of origin is approximately at the exit face 26 of the optical source 10. In the horizontal plane of beam propagation shown in FIG. 2B, the effective focal point of origin is approximately where the laser diode and amplifier portions 16 and 18 meet. The two focal points of origin are separated by a distance $D_1$ that is essentially equal to the optical length of the amplifier portion 18.

The first focusing element 12 is a symmetrical focusing lens, which means it has the same focal length $F_1$ (i.e., same optical focusing power) in both the vertical and horizontal planes of beam propagation. Lens 12 is placed approximately one focal length $F_1$ away from the output face of the optical source 10 (i.e., the focal point of origin in the vertical plane of beam propagation), so that the beam 22 is generally collimated in the vertical plane of beam propagation (see FIG. 2A). In the horizontal plane of beam propagation, the beam 20 is focused down by lens 12 to a small spot size (i.e., small beam diameter) at an image position $I_p$ located at a distance $D_2$ from lens 12 (see FIG. 2B). As explained in more detail below, $D_2$ is greater than $F_1$.

The second focusing element 14 is a non-symmetrical focusing lens (e.g., a cylindrical lens), which means it has a focal length $F_2$ in the vertical plane of beam propagation but essentially no optical focusing power in the horizontal plane of beam propagation. Lens 14 is placed approximately one focal length $F_2$ away from the image position $I_p$ (i.e., a distance $D_3$ away from first lens 12), so that the collimated beam in the vertical plane of beam propagation is focused down to a small spot size at the image position $I_p$ (see FIG. 2A), while not providing any optical focusing power in the horizontal plane of beam propagation (see FIG. 2B).

Any appropriate user application can be positioned at the image position $I_p$. The user application shown as an example in FIGS. 2A and 2B, and used in the following discussion, is a single mode optical fiber 28 having an input face 29 disposed at the image position $I_p$, whereby the optical beam 22 is coupled into optical fiber 28 for transmission to another location. However, it should be appreciated that the present invention is not limited to optical fiber applications at image position $I_p$.

The selection of focal lengths $F_1/F_2$ and spacing $D_2/D_3$ for lenses 12 and 14 to achieve the proper spot size, numerical aperture, and astigmatism correction at image position $I_p$ are determined from the following equations.

Numerical aperture $N_A$ is defined as:

$$N_A = \sin\theta$$

where θ is the half angle of diverging or converging light. The converging light entering the optical fiber cannot exceed the acceptance numerical aperture for the fiber so that all of the light incident thereon can be properly coupled into the fiber without significant optical loss. In most cases, the numerical aperture of the optical beam exiting the MOPA exceeds the acceptance numerical aperture of the optical fiber. Thus, not only must the optical focusing system compensate for astigmatism, but it must also focus the beam down to a sufficiently small spot size for coupling into the optical fiber without exceeding the acceptance numerical aperture in either of the planes of beam propagation. This can be achieved so long as the magnification M of the optical system defined by first and second lenses 12 and 14 is sufficiently high, as described below.

The magnification M of a single lens is defined as:

$$M = \frac{\text{lens to image distance}}{\text{lens to object distance}} \quad (2)$$

Thus, for lens 12 in the horizontal plane of beam propagation (see FIG. 2B), magnification $M_H$ is:

$$M_H = \frac{D_2}{F_1 + D_1} \quad (3)$$

Moreover, for thin lens optics, $$\frac{1}{\text{lens focal length}} = \frac{1}{\text{lens image distance}} + \frac{1}{\text{lens object distance}} \quad (4)$$

Thus, for lens 12 in the horizontal plane of beam propagation:

$$\frac{1}{F_1} = \frac{1}{D_2} + \frac{1}{F_1 + D_1} \quad (5)$$

For a pair of lenses with collimated light therebetween, the magnification is the ratio of the focal distances of the lenses. Thus, for lenses 12 and 14 in the vertical plane of beam propagation (see FIG. 2A), magnification $M_v$ is:

$$M_v = \frac{F_2}{F_1} \quad (6)$$

In order for the light beam to have proper convergence characteristics at the image position $I_p$, the magnification of the optics between the optical source 10 and the optical fiber 28 should meet the following criteria:

$$M = \frac{N_A \text{ of the optical source output beam}}{\text{Acceptance } N_A \text{ of the optical fiber}} \quad (7)$$

where the $N_A$ of the optical source output beam will most likely be different in the vertical and horizontal planes of beam propagation, and the acceptance $N_A$ of the optical fiber will most likely be the same in the vertical and horizontal planes of beam propagation.

Combining equations (3) and (7) for the horizontal plane of beam propagation yields:

$$\frac{D_2}{F_1 + D_1} = \frac{\text{Optical source output beam } N_A \text{ in horizontal plane of beam propagation}}{\text{Acceptance } N_A \text{ of the optical fiber}} \quad (8)$$

Combining equations (6) and (7) for the vertical plane of beam propagation yields:

$$\frac{F_2}{F_1} = \frac{\text{Optical source output beam } N_A \text{ in vertical plane of beam propagation}}{\text{Acceptance } N_A \text{ of the optical fiber}} \quad (9)$$

Once a MOPA device (having known numerical apertures) has been selected, and the application requirements have been determined (e.g., optical fiber with known acceptance $N_A$), the lens focal lengths and positions are easily calculated using the above equations to produce the desired convergence properties (e.g., symmetric numerical aperture and spot size) at image position $I_p$. For example, lenses with focal lengths $F_1$ and $F_2$ can be selected to provide the proper magnification according to equation (9), and $D_2$ can be calculated using equation (8), where F1, F2, and D2 can be used to position the lenses 12 and 14 and optical fiber input face 29 relative to the MOPA 10. Alternatively, if space considerations dictate a particular value for $D_2$, then the requisite focal length $F_1$ can be calculated using equation (8), and the requisite focal length $F_2$ can be calculated using equation (9). If the lenses 12 and 14 have already been selected, then an appropriate optical fiber acceptance $N_A$ can be determined using equation (9).

The present invention is an asymmetrical optical system, with a single lens coupling system in one plane of beam propagation, and a two lens coupling system in an orthogonal plane of beam propagation. The optical system is a simple, elegant, low cost solution to a complicated optical problem because it uses only a pair of standard, widely available focusing lenses to couple highly astigmatic light into an optical fiber (or any other application) with a generally symmetric spot size and numerical aperture, in a manner that is easy to align, relatively insensitive to misalignment, and with straight forward optical aberration correction.

The asymmetrical optical system of the present invention is quite simple to align once the lenses and their spacing have been determined as discussed above. First lens 12 is initially aligned to the optical source 10 to produce generally collimated light in the vertical plane of beam propagation, and the input face of the optical fiber 28 is aligned to the focal point of the light in the horizontal plane of beam propagation. This is a straight forward, single lens coupling alignment, made even simpler given that the image spot size is important for only one plane of beam propagation. During the alignment of first lens 12, second lens 14 can be placed near its expected position in beam 22, but its exact position is not crucial because second lens 14 has no optical power in the horizontal plane of beam propagation. Then, the position of second lens 14 is adjusted to focus the collimated light in the vertical plane of beam propagation down to a spot at the optical fiber input face. This is also a straight forward alignment given that only one lane of beam propagation is affected and light in this plane is collimated.

While the above equations can be used to select and position appropriate lenses 12 and 14, optical simulation (ray-tracing) software (which is well known in the art) can also be used as well. Using the two lens configurations of the present invention and the above equations as a starting point, an optical designer using ray-tracing software can dynamically manipulate the optical variables ($D_1$, $D_2$, $D_3$, $F_1$, $F_2$, numerical apertures, etc.) to produce simulations of the collimated/focused beam portions of the present invention, resulting in the optimal beam spot size and numerical aperture with minimal aberration at the image position $I_p$ for the user's application.

Figure 3A:
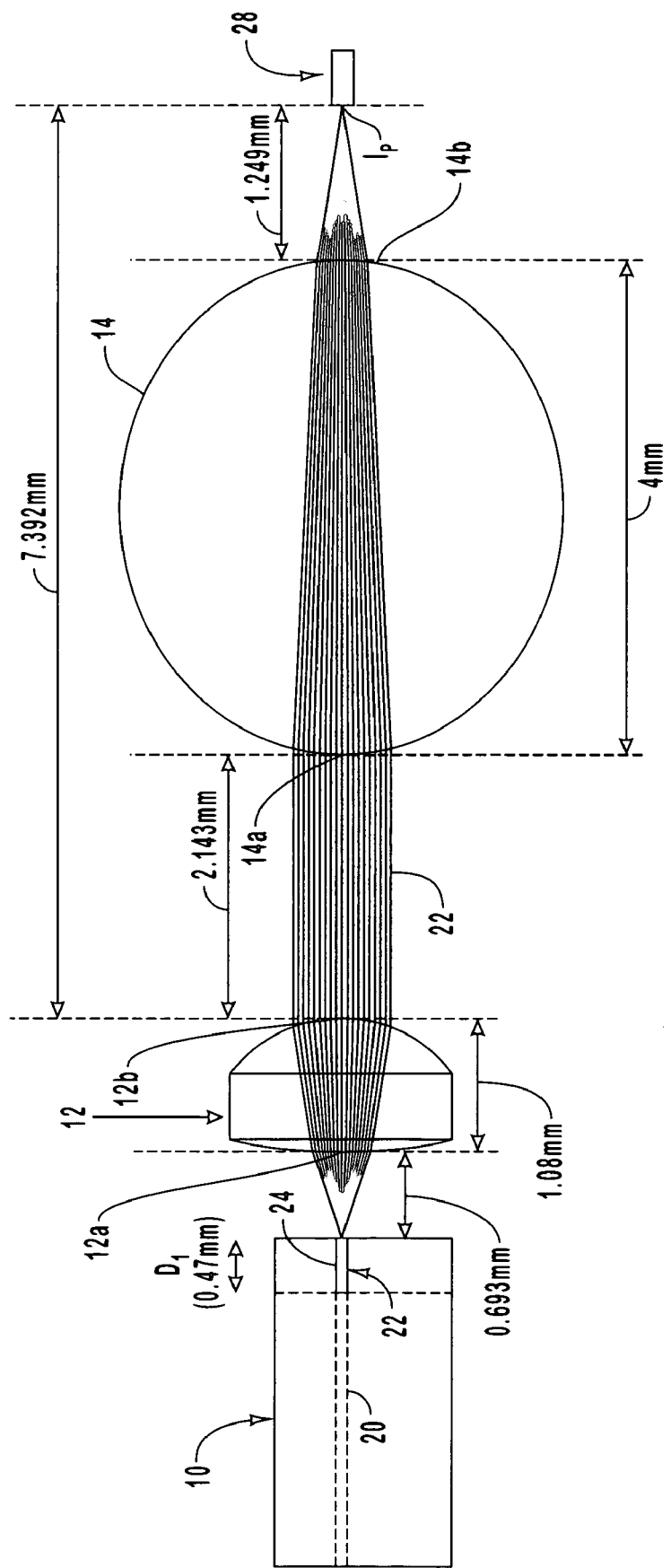
FIG. 3A is a side cross-sectional view of an exemplary embodiment of the optical focusing system of the present invention.
Figure 3B:
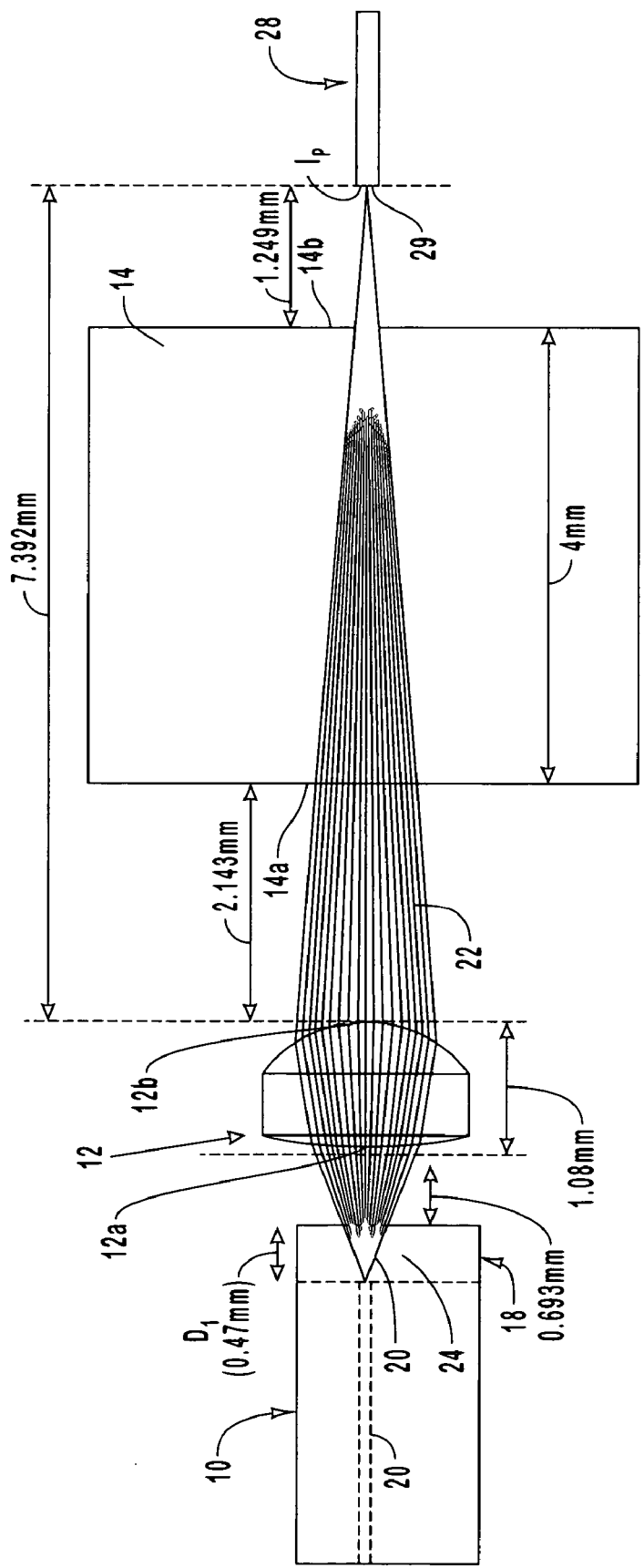
FIG. 3B is a top cross-sectional view of the exemplary embodiment of the optical focusing system of the present invention.

FIGS. 3A and 3B illustrate an example of the coupling system of the present invention that has been designed and reduced to practice using the above equations and ray-tracing software. Optical source 10 in this example is a MOPA device having 470 microns (air equivalent) of astigmatism, with an optical output beam having a half angle divergence of about 30 degrees. Thus, according to equation (1), this MOPA device has a numerical aperture of 0.5. The optical application is a single mode optical fiber 28 having an acceptance numerical aperture of 0.13. Therefore, the optical coupling system should have a magnification of at least 3.84 as calculated by equation (7). In order to provide some tolerance in this example optical focusing system, the target magnification is rounded up to 4.0.

In order to achieve the target magnification and adequately compensate for the 470 microns of astigmatism, a double aspheric lens is selected as the first lens 12, and a rod lens is selected as second lens 14. The selected double aspheric lens is a microlens model number 310A, obtained from the optics division of Hoya Corporation. This microlens has a 2.7 mm diameter, and a 1.08 mm thickness. It is selected because of its high quality and low aberration, as well as for having optical specifications that provide the desired (4.0) magnification in the horizontal plane of beam propagation while collimating the light in the vertical plane of beam propagation. The rod lens 14 has a 4 mm diameter.

The positions of the optical elements are as follows. The front face 12a of double aspheric lens 12 is positioned 0.693 mm away from the output face of the MOPA device 10, in order to generally collimate the light in the vertical plane of beam propagation. At this position, in the horizontal plane of beam propagation, the double aspheric lens 12 produces a focused beam of desired diameter at a distance of 7.392 mm from the rear face 12b of double aspheric lens 12. The input face 29 of optical fiber 28 is therefore disposed at this image position $I_p$. The back face 14b of rod lens 14 is positioned 1.249 mm away from image position $I_p$ (and thus the front face 14a of rod lens 14 is positioned 2.143 mm from the back face 12b of double aspheric lens 12), in order to properly focus the collimated light in the vertical plane of beam propagation at the image position $I_p$. With these optical elements so positioned, the optical output of the MOPA device is focused down to a generally uniform spot size and numerical aperture at image position $I_p$.

It is to be understood that the present invention is not limited to the embodiment(s) described above and illustrated herein, but encompasses all variations falling within the scope of the appended claims. For example, the magnification calculated by equation 7 is the minimum magnification needed to properly focus the light beam into the optical fiber. In actuality, greater magnifications will work as well, which gives workable tolerance to the optical focusing system. Therefore, equations (8) and (9), respectively, can be rewritten as:

$$\frac{D_2}{F_1+D_1} \geq \frac{\text{Optical source output beam } N_A \text{ in horizontal plane of beam propagation}}{\text{Acceptance } N_A \text{ of the optical fiber}} \quad (10)$$

$$\frac{F_2}{F_1} \geq \frac{\text{Optical source output beam } N_A \text{ in vertical plane of beam propagation}}{\text{Acceptance } N_A \text{ of the optical fiber}} \quad (11)$$

Equations (10) and (11) also take into consideration the fact that the optical beam can be focused into the optical fiber with a numerical aperture that is well under the acceptance numerical aperture (i.e., acceptance numerical aperture represents the maximum angle of convergence that the optical fiber will accept).

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optical device comprising:
   an optical source for producing an optical beam having spaced apart first and second focal points of origin in orthogonal first and second planes of beam propagation of the optical beam, respectively;
   a first lens disposed in an optical path of the optical beam and having a first optical focusing power in both the first and second planes of beam propagation, wherein the first lens is disposed at a first distance from the first focal point of origin for generally collimating the optical beam in the first plane of beam propagation and for focusing the optical beam down to a first beam diameter in the second plane of beam propagation at an image position located a second distance from the first lens; and
   a second lens disposed in the optical path of the optical beam and having a second optical focusing power in the first plane of beam propagation and generally no optical focusing power in the second plane of beam propagation, wherein the second lens is disposed at a third distance from the image position for focusing the optical beam down to a second beam diameter in the first plane of beam propagation at the image position;
   an optical fiber having an input end disposed at the image position for receiving the optical beam;
   the optical beam incident upon the first lens has a first numerical aperture in the first plane of beam propagation;
   the optical fiber has an acceptance numerical aperture associated therewith; and
   the first numerical aperture divided by the acceptance numerical aperture is substantially equal to or less than the second focal length divided by the first focal length.

2. The optical device of claim 1, wherein the first and second beam diameters are substantially equal to each other.

3. The optical device of claim 2, wherein at the image position, the optical beam has a numerical aperture in the first plane of beam propagation that is substantially equal to that of the beam in the second plane of beam propagation.

4. The optical device of claim 1, wherein the first lens has a focal length, and wherein the first distance is substantially equal to the first lens focal length.

5. The optical device of claim 4, wherein the second lens has a focal length, and wherein the third distance is substantially equal to the second lens focal length.

6. The optical device of claim 1, wherein:
the optical beam incident upon the first lens has a second numerical aperture in the second plane of beam propagation;
the optical fiber has an acceptance numerical aperture associated therewith;
the first and second focal points of origin are separated by a fourth distance; and
the second numerical aperture divided by the acceptance numerical aperture is substantially equal to or less than the second distance divided by the sum of the first focal length and the fourth distance.

7. The optical device of claim 6, wherein:
the second numerical aperture divided by the acceptance numerical aperture is substantially equal to the second distance divided by the sum of the first focal length and the fourth distance.

8. The optical device of claim 1, wherein:
the first numerical aperture divided by the acceptance numerical aperture is substantially equal to the second focal length divided by the first focal length.

9. The optical device of claim 1, wherein the second lens is a cylindrical lens.

10. The optical device of claim 1, wherein the optical source is a master oscillator power amplifier having a diode laser portion for generating the optical beam and a planar waveguide amplifier portion for amplifying the optical beam, and wherein the second focal point of origin is located approximately at a location where the optical beam exits the diode laser portion, and the first focal point of origin is located approximately at a location where the optical beam exits the planar waveguide amplifier portion.

11. An optical system for focusing an optical beam into an input face of an optical fiber, wherein the optical beam has spaced apart first and second focal points of origin in orthogonal first and second planes of beam propagation of the optical beam, respectively, the optical system comprising:
a first lens disposed in an optical path of the optical beam and having a first optical focusing power in both the first and second planes of beam propagation, wherein the first lens is disposed at a first distance from the first focal point of origin for generally collimating the optical beam in the first plane of beam propagation and for focusing the optical beam down to a first beam diameter in the second plane of beam propagation at an image position located a second distance from the first lens; and
a second lens disposed in an optical path of the optical beam and having a second optical focusing power in the first plane of beam propagation and generally no focusing power in the second plane of beam propagation, wherein the second lens is disposed at a third distance from the image position for focusing the optical beam down to a second beam diameter in the first plane of beam propagation at the image position;
the optical beam incident upon the first lens has a first numerical aperture in the first plane of beam propagation;
the optical fiber has an acceptance numerical aperture associated therewith; and
the first numerical aperture divided by the acceptance numerical aperture is substantially equal to or less than the second focal length divided by the first focal length.

12. The optical system of claim 11, wherein the first and second beam diameters are substantially equal to each other.

13. The optical system of claim 12, wherein at the image position, the optical beam has a numerical aperture in the first plane of beam propagation that is substantially equal to that of the beam in the second plane of beam propagation.

14. The optical system of claim 11, wherein the first lens has a focal length, and wherein the first distance is substantially equal to the first lens focal length.

15. The optical system of claim 14, wherein the second lens has a focal length, and wherein the third distance is substantially equal to the second lens focal length.

16. The optical system of claim 11, wherein:
the optical beam incident upon the first lens has a second numerical aperture in the second plane of beam propagation;
the optical fiber has an acceptance numerical aperture associated therewith;
the first and second focal points of origin are separated by a fourth distance; and
the second numerical aperture divided by the acceptance numerical aperture is substantially equal to or less than the second distance divided by the sum of the first focal length and the fourth distance.

17. The optical system of claim 16, wherein:
the second numerical aperture divided by the acceptance numerical aperture is substantially equal to the second distance divided by the sum of the first focal length and the fourth distance.

18. The optical system of claim 11, wherein:
the first numerical aperture divided by the acceptance numerical aperture is substantially equal to the second focal length divided by the first focal length.

19. The optical system of claim 11, wherein the second lens is a cylindrical lens.

20. A method of focusing an astigmatic optical beam, comprising:
producing an optical beam having spaced apart first and second focal points of origin in orthogonal first and second planes of beam propagation of the optical beam, respectively;
placing a first lens in the optical beam and having a first optical focusing power in both the first and second planes of beam propagation, wherein the first lens is placed at a first distance from the first focal point of origin for generally collimating the optical beam in the first plane of beam propagation and for focusing the optical beam down to a first beam diameter in the second plane of beam propagation at an image position located a second distance from the first lens;
placing a second lens in the optical beam and having a second optical focusing power in the first plane of beam propagation and generally no optical focusing power in the second plane of beam propagation, wherein the second lens is placed at a third distance from the image position for focusing the optical beam down to a second beam diameter in the first plane of beam propagation at the image position;
placing an input end of an optical fiber at the image position for receiving the optical beam; and
the optical beam incident upon the first lens has a first numerical aperture in the first plane of beam propagation;

the optical fiber has an acceptance numerical aperture associated therewith; and the first numerical aperture divided by the acceptance numerical aperture is substantially equal to or less than the second focal length divided by the first focal length.

21. The method of claim 20, wherein the first and second focused beam diameters are substantially equal to each other.

22. The method of claim 21, wherein at the image position, the optical beam has a numerical aperture in the first plane of beam propagation that is substantially equal to that of the beam in the second plane of beam propagation.

23. The method of claim 20, wherein the first lens has a focal length, and wherein the first distance is substantially equal to the first lens focal length.

24. The method of claim 23, wherein the second lens has a focal length, and wherein the third distance is substantially equal to the second lens focal length.

25. The method of claim 20, wherein:

the optical beam incident upon the first lens has a second numerical aperture in the second plane of beam propagation;

the optical fiber has an acceptance numerical aperture associated therewith;

the first and second focal points of origin are separated by a fourth distance; and the second numerical aperture divided by the acceptance numerical aperture is substantially equal to or less than the second distance divided by the sum of the first focal length and the fourth distance.

26. The method of claim 25, wherein the second numerical aperture divided by the acceptance numerical aperture is substantially equal to the second distance divided by the sum of the first focal length and the fourth distance.

27. The method of claim 20, wherein the first numerical aperture divided by the acceptance numerical aperture is substantially equal to the second focal length divided by the first focal length.

28. The method of claim 20, wherein the second lens is a cylindrical lens.

29. The method of claim 20, wherein producing the optical beam comprises:

generating the optical beam with a diode laser; and amplifying the generated optical beam with a planar waveguide amplifier;

wherein the second focal point of origin is located approximately at a location where the optical beam exits the diode laser, and the first focal point of origin is located approximately at a location where the optical beam exits the planar waveguide amplifier.

30. An optical system for focusing an optical beam into an input face of an optical fiber, wherein the optical beam has spaced apart first and second focal points of origin in orthogonal first and second planes of beam propagation of the optical beam, respectively, the optical system comprising:

a first lens disposed in an optical path of the optical beam and having a first optical focusing power in both the first and second planes of beam propagation, wherein the first lens is disposed at a first distance from the first focal point of origin so as to substantially collimate the optical beam in the first plane of beam propagation and focus the optical beam down to a first beam diameter in the second plane of beam propagation at an image position located a second distance from the first lens; and a second lens disposed in an optical path of the optical beam and having a second optical focusing power in the first plane of beam propagation, wherein the second lens is disposed at a third distance from the image position so as to focus the optical beam down to a second beam diameter in the first plane of beam propagation at the image position, wherein:

the optical beam incident upon the first lens has a second numerical aperture in the second plane of beam propagation;

the optical fiber has an acceptance numerical aperture associated therewith;

the first and second focal points of origin are separated by a fourth distance; and the second numerical aperture divided by the acceptance numerical aperture is substantially equal to or less than the second distance divided by the sum of the first focal length and the fourth distance.

31. The optical system of claim 30, wherein:

the second numerical aperture divided by the acceptance numerical aperture is substantially equal to the second distance divided by the sum of the first focal length and the fourth distance.

32. An optical system for focusing an optical beam into an input face of an optical fiber, wherein the optical beam has spaced apart first and second focal points of origin in orthogonal first and second planes of beam propagation of the optical beam, respectively, the optical system comprising:

a first lens disposed in an optical path of the optical beam and having a first optical focusing power in both the first and second planes of beam propagation, wherein the first lens is disposed at a first distance from the first focal point of origin so as to substantially collimate the optical beam in the first plane of beam propagation and focus the optical beam down to a first beam diameter in the second plane of beam propagation at an image position located a second distance from the first lens; and a second lens disposed in an optical path of the optical beam and having a second optical focusing power in the first plane of beam propagation, wherein the second lens is disposed at a third distance from the image position so as to focus the optical beam down to a second beam diameter in the first plane of beam propagation at the image position, wherein:

the optical beam incident upon the first lens has a first numerical aperture in the first plane of beam propagation;

the optical fiber has an acceptance numerical aperture associated therewith; and the first numerical aperture divided by the acceptance numerical aperture is substantially equal to or less than the second focal length divided by the first focal length.

33. The optical system of claim 32, wherein:

the first numerical aperture divided by the acceptance numerical aperture is substantially equal to the second focal length divided by the first focal length.

* * * * *